US007400013B1

(12) United States Patent
Ariyoshi (10) Patent No.: US 7,400,013 B1
(45) Date of Patent: Jul. 15, 2008

(54) HIGH-VOLTAGE TRANSISTOR HAVING A U-SHAPED GATE AND METHOD FOR FORMING SAME

(75) Inventor: Junichi Ariyoshi, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 230 days.

(21) Appl. No.: 11/003,528

(22) Filed: Dec. 3, 2004

(51) Int. Cl.
*H01L 23/62* (2006.01)
(52) U.S. Cl. ......................... 257/330; 257/332; 257/500
(58) Field of Classification Search ................... 257/330, 257/500, 332
See application file for complete search history.

(56) References Cited

U.S. PATENT DOCUMENTS 5,808,340 A * 9/1998 Wollesen et al. ............. 257/330

6,136,675 A * 10/2000 Lee .............................. 438/585

* cited by examiner

*Primary Examiner*—Douglas M Menz
(74) *Attorney, Agent, or Firm*—Farjami & Farjami LLP (57) ABSTRACT

According to one exemplary embodiment, a method includes forming first, second, and third shallow trench isolation regions in a substrate, wherein the second shallow trench isolation region is situated between the first and the third shallow trench isolation regions. The second shallow trench isolation region is removed to form a transistor channel trench. A substantially U-shaped gate is formed in the transistor channel trench. According to another embodiment, a transistor includes a substrate, and first and second shallow trench isolation regions in the substrate. A substantially U-shaped gate is formed in the substrate between said first and second shallow trench isolation regions.

6 Claims, 7 Drawing Sheets

HIGH-VOLTAGE TRANSISTOR HAVING A U-SHAPED GATE AND METHOD FOR FORMING SAME

TECHNICAL FIELD

The present invention is generally in the field of semiconductor devices. More particularly, the present invention is in the field of fabrication of transistors.

BACKGROUND ART

Conventional transistors, such as field effect transistors (FETs), typically exhibit a low value of BVdss and a low punch-through voltage. Conventional FETs typically have gates that are formed substantially parallel to the substrates on which they reside. Lightly doped drain (LDD) regions of conventional FETs overlap the gates in planes horizontal to the surfaces of the substrates. Due to this overlap, the breakdown voltage (BVdss) of a conventional FET as measured between an LDD region and the substrate is disadvantageously low.

Previous attempts at compensating for the low BVdss of conventional transistors include increasing the length of spacers so that the overlap between the LDD regions and the gate is minimized. Unfortunately, this technique increases the size of the transistor.

A further drawback of conventional FETs is that it is difficult to control the dopant profile because the dopant profile is in the x-axis direction (parallel to the surface of the substrate). Therefore, conventional approaches typically do not achieve an increased value of BVdss.

Furthermore, conventional approaches exhibit punch-through degradation problems. Conventional approaches additionally increase the size of the transistor in order to maintain a desired channel length in an attempt to minimize the overlap between the LDD regions and the gate in the x-axis direction.

Thus, there is a need in the art for a method of fabricating a transistor, such as an FET, that achieves a desired value of BVdss and a desired punch-through voltage while decreasing the transistor size without compromising channel length.

SUMMARY

The present invention is directed to a high-voltage transistor having a U-shaped gate and a method for forming the same. The present invention addresses and resolves the need in the art for a method of fabricating a transistor, such as a field effect transistor (FET), that achieves a desired value of breakdown voltage (BVdss) and a desired punch-through voltage while decreasing the transistor size without compromising channel length.

According to one exemplary embodiment, a method includes forming first, second, and third shallow trench isolation regions in a substrate, wherein the second shallow trench isolation region is situated between the first and the third shallow trench isolation regions. The second shallow trench isolation region is removed to form a transistor channel trench. A substantially U-shaped gate is formed in the transistor channel trench.

According to another exemplary embodiment, a transistor includes a substrate, and first and second shallow trench isolation regions in the substrate. A substantially U-shaped gate is formed in the substrate between said first and second shallow trench isolation regions.

Other features and advantages of the present invention will become more readily apparent to those of ordinary skill in the art after reviewing the following detailed description and accompanying drawings.

DETAILED DESCRIPTION OF THE INVENTION

The present invention is directed to a high-voltage transistor having a U-shaped gate and a method for forming the same. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It should be borne in mind that, unless noted otherwise, like or corresponding elements among the figures may be indicated by like or corresponding reference numerals.

Figure 1:
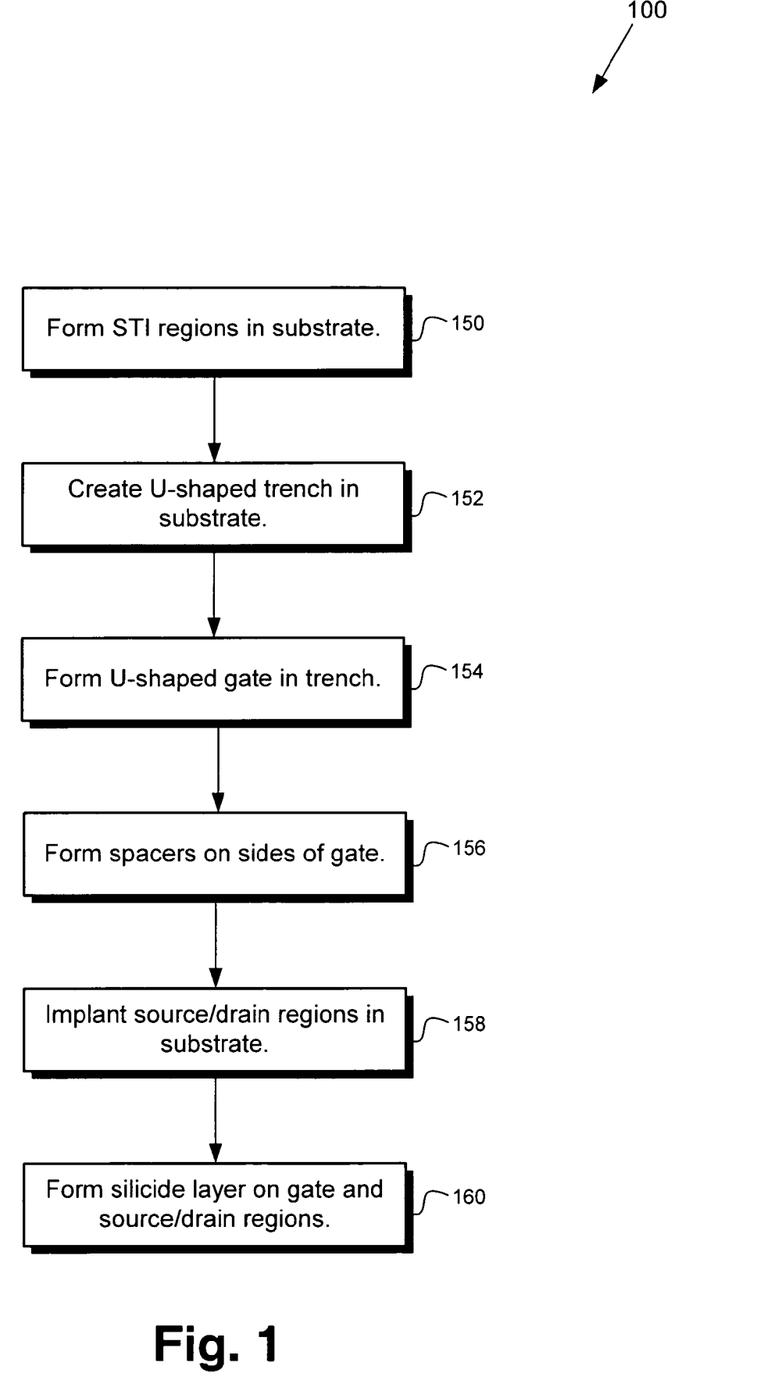
FIG. 1 is a flowchart corresponding to exemplary method steps according to one embodiment of the present invention.

FIG. 1 shows a flowchart illustrating an exemplary method according to an embodiment of the present invention. Certain details and features have been left out of flowchart 100 that are apparent to a person of ordinary skill in the art. For example, a step may consist of one or more substeps or may involve specialized equipment, as is known in the art. While steps 150 through 160 indicated in flowchart 100 are sufficient to describe one embodiment of the present invention, other embodiments of the invention may use steps different from those shown in flowchart 100.

Referring to FIGS. 2A, 2B, 2C, 2D, 2E, and 2F, each of structures 250, 252, 254, 256, 258, and 260 illustrates the result of performing steps 150, 152, 154, 156, 158, and 160, respectively, of flowchart 100 of FIG. 1. For example, structure 250 shows the result of performing step 150, structure 252 shows the result of performing step 152, and so forth.

Figure 2A:
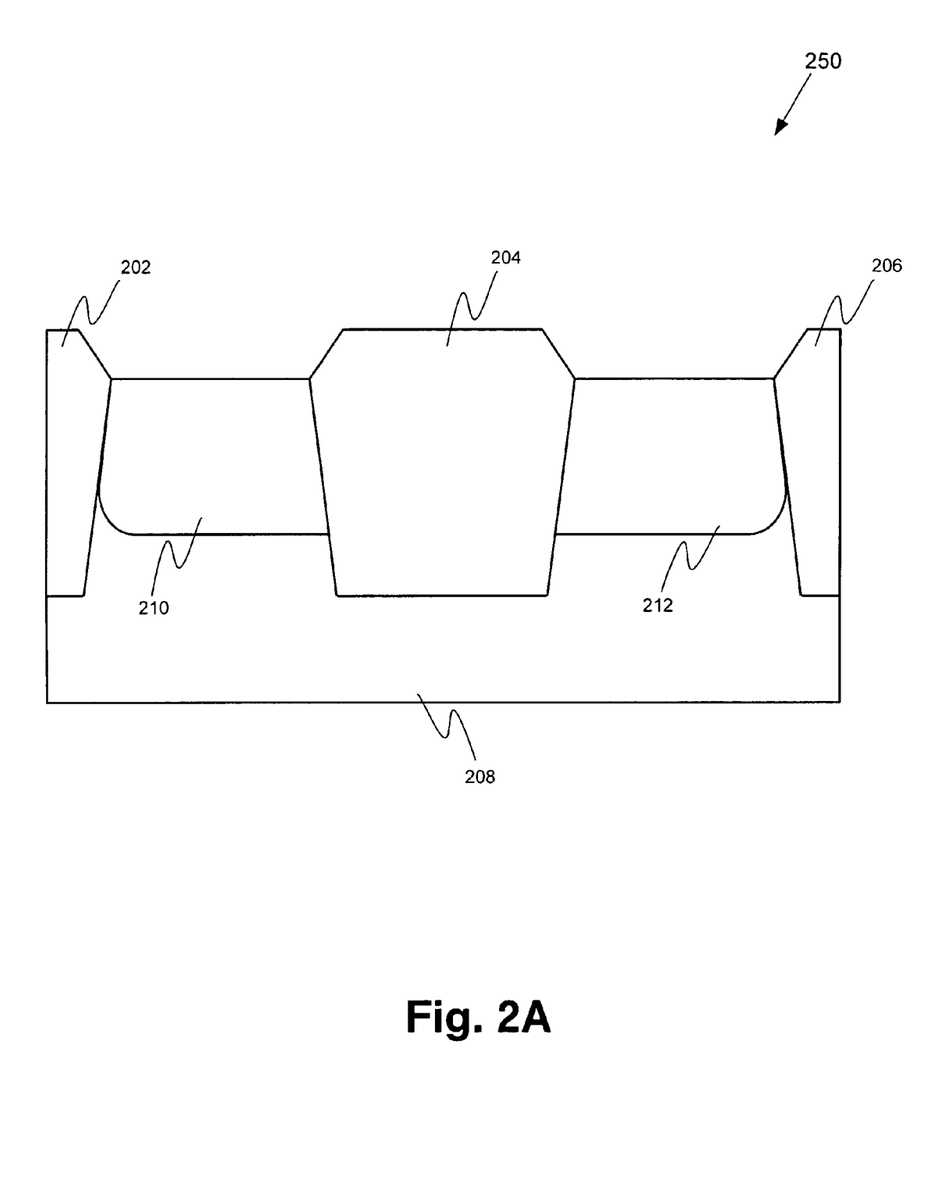
FIG. 2A illustrates a cross-sectional view, which includes portions of an exemplary structure fabricated according to an embodiment of the present invention and a corresponding process step of the flowchart of FIG. 1.

Reference is now made to step 150 in flowchart 100 of FIG. 1, and the resulting structure 250 in FIG. 2A. Structure 250 is a portion of a structure formed after shallow trench isolation (STI) regions 202, 204, and 206 are formed in substrate 208. STI region 204 will be etched out and will become a transistor channel trench in a subsequent step.

Lightly doped drain (LDD) implant regions 210 and 212 are subsequently formed in substrate 208. LDD implant region 210 is formed between STI region 202 and STI region 204. LDD implant region 212 is formed between STI region 204 and STI region 206. In one embodiment, LDD implant regions 210 and 212 are formed using an n-type doping as is known in the art.

Figure 2B:
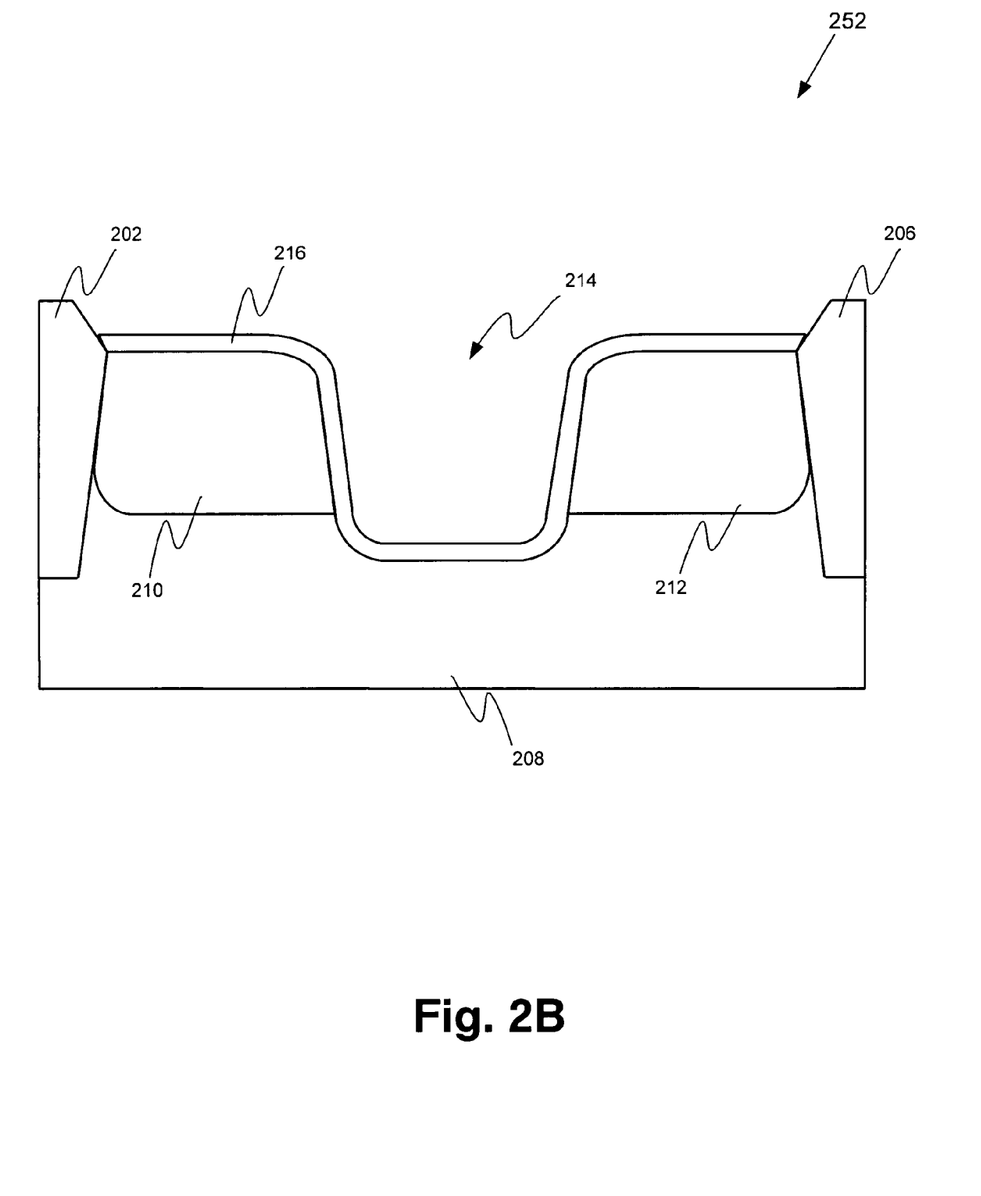
FIG. 2B illustrates a cross-sectional view, which includes portions of an exemplary structure fabricated according to an embodiment of the present invention and a corresponding process step of the flowchart of FIG. 1.

Referring to step 152 in FIG. 1 and structure 252 in FIG. 2B, at step 152 of flowchart 100, a U-shaped trench is created in substrate 208 by depositing photo-resist layers (not shown) over STI regions 202 and 206. Then, using a wet-etch process, STI region 204 is etched away leaving U-shaped transistor channel trench 214. STI regions 202 and 206 remain intact due to the protective photoresist layers residing thereon. The photoresist layers are subsequently etched away.

After the photoresist layers are etched away, a voltage threshold (Vt) implant into the region beneath transistor channel trench 214 is performed to control the threshold voltage of the transistor that will be formed in transistor channel trench 214. Gate silicon dioxide ("oxide") layer 216 is then grown, as shown in FIG. 2B. Oxide layer 216 is grown so as to cover LDD regions 210 and 212, as well as the bottom and sides of transistor channel trench 214.

Figure 2C:
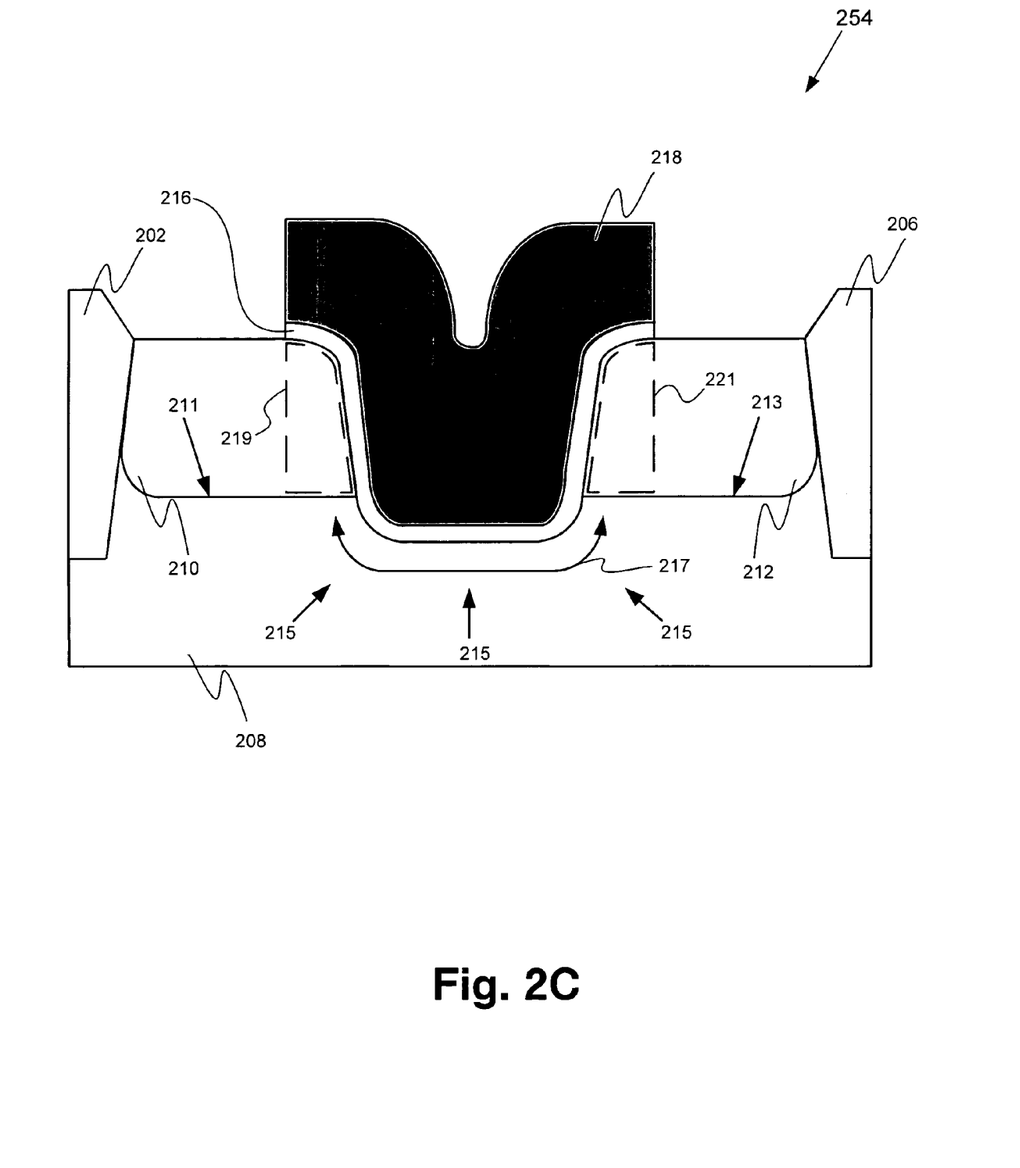
FIG. 2C illustrates a cross-sectional view, which includes portions of an exemplary structure fabricated according to an embodiment of the present invention and a corresponding process step of the flowchart of FIG. 1.

Referring to step 154 in FIG. 1 and structure 254 in FIG. 2C, at step 154 of flowchart 100, U-shaped gate 218 is formed in transistor channel trench 214. In order to form gate 218, a layer of polysilicon is deposited over oxide layer 216 on the bottom of transistor channel trench 214 using a chemical vapor deposition (CVD) process or other suitable process. The layer of polysilicon is patterned with a photoresist, for example, over transistor channel trench 214. The areas of polysilicon not covered by the photoresist are etched away, leaving substantially U-shaped gate 218. As used herein "substantially U-shaped" is used to refer to a shape that is similar to a "U," "V," "Y," or the like.

Advantageously, in one embodiment, gate 218 has been formed with a substantially U-shape at channel region 215. It is noted that LDD regions 210 and 212 have diffusion edges 211 and 213, respectively. It is also noted that the length of the channel is referred to as channel length 217, and can be measured from diffusion edge 211 to diffusion edge 213 along oxide layer 216.

Conventional FETs, in contrast, typically have gates that are formed substantially parallel to the substrates on which they reside. LDD regions of conventional FETs overlap the gates in planes horizontal to the surfaces of the substrates. The greater the length of the overlap, the higher the value for the breakdown voltage (BVdss). Due to this overlap, the BVdss of a conventional FET as measured between an LDD region and the substrate is disadvantageously low.

Previous attempts at compensating for the low BVdss of conventional FETs include increasing the length of the spacers so that the overlap between the LDD regions and the gate is minimized. Unfortunately, this technique increases the size of the transistor.

A further drawback of conventional FETs is that it is difficult to control the dopant profile because the dopant profile in the x-axis direction (parallel to the surface of the substrate) depends on the implant distribution and thermal distribution after the LDD implant. Therefore, by forming a U-shaped trench and rotating the direction of the overlap in accordance with embodiments of the present invention, the dopant profiles of overlap regions 219 and 221 are easier to control when implanting due to the substantially or nearly y-axis direction (orthogonal to the plane of the surface of the substrate). In other words, the present technique advantageously makes it easier to control (e.g. increase) BVdss.

Furthermore, embodiments according to the present invention advantageously allow for channel length 217 to be maintained while decreasing the size of the device. For example, some conventional FETS range from about 0.7 to about 0.9 microns in length. Embodiments according to the present invention allow for a transistor having a length of about 0.5 microns, or even less, without compromising channel length 217. This advantageous decrease in transistor length and/or increase in gate 218 length is accomplished by the bowing in U-shaped gate 218.

Maintaining channel length 217 is important for preventing punch-through degradation problems. Punch-through can occur in a FET when an uncontrolled current flows between the source and drain regions. Embodiments according to the present invention advantageously improve punch-through characteristics due to the shape of gate 218, which allows for channel length 217 to be increased without a corresponding increase in the length of the transistor. Conventional approaches, in contrast, increase the size of the transistor in order to maintain a desired channel length due to the overlap between of the NDD regions and the gate in the x-axis direction.

Figure 2D:
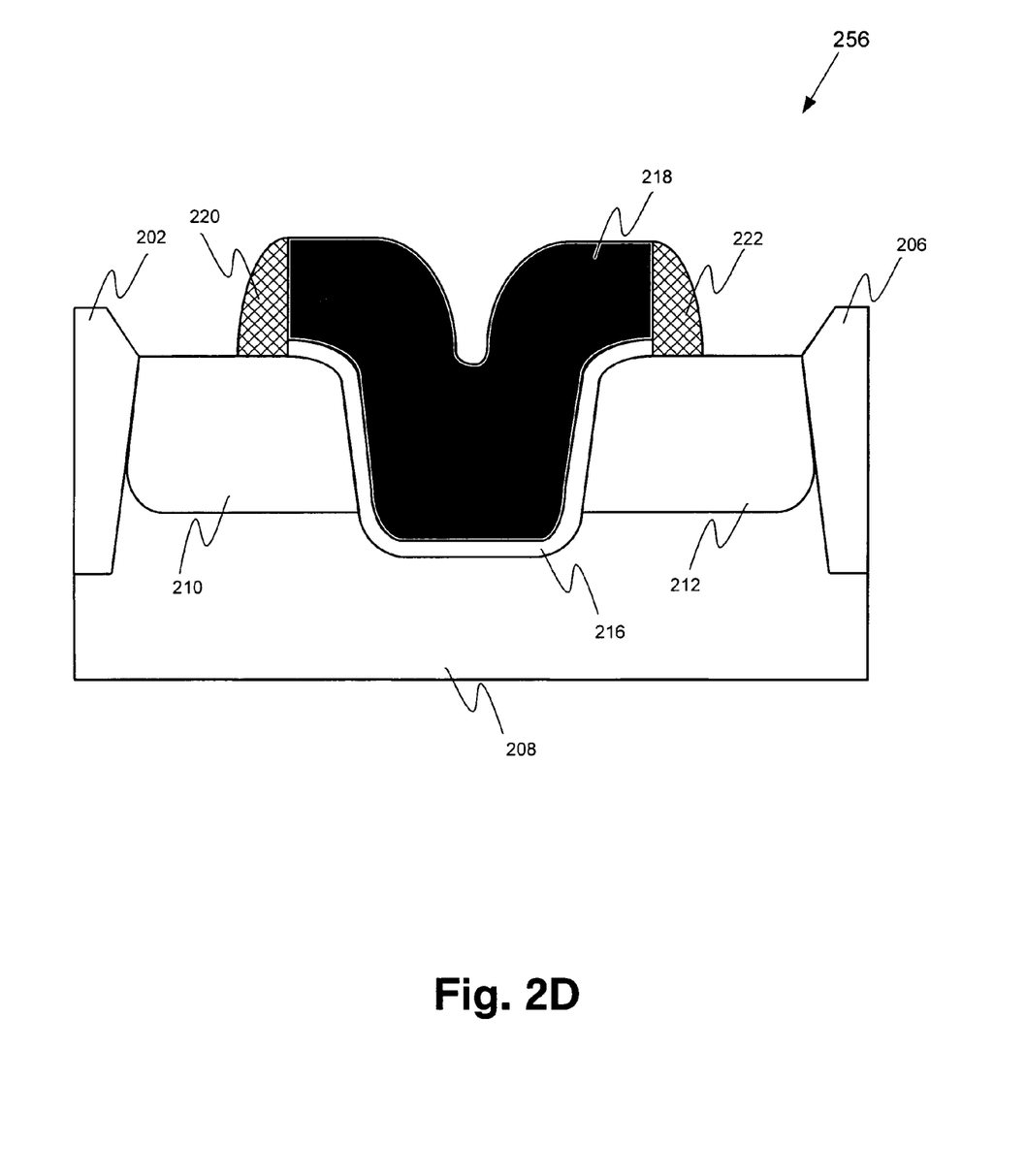
FIG. 2D illustrates a cross-sectional view, which includes portions of an exemplary structure fabricated according to an embodiment of the present invention and a corresponding process step of the flowchart of FIG. 1.

Referring to step 156 in FIG. 1 and structure 256 in FIG. 2D, at step 156 of flowchart 100, spacers 220 and 222 are formed on the sides of gate 218 by first forming a conformal oxide layer over LDD region 210, gate 218, and LDD region 212. Subsequently, a nitride layer is formed over the conformal oxide layer. An etch of the nitride layer and conformal oxide layer is then accomplished, resulting in spacers 220 and 222.

Figure 2E:
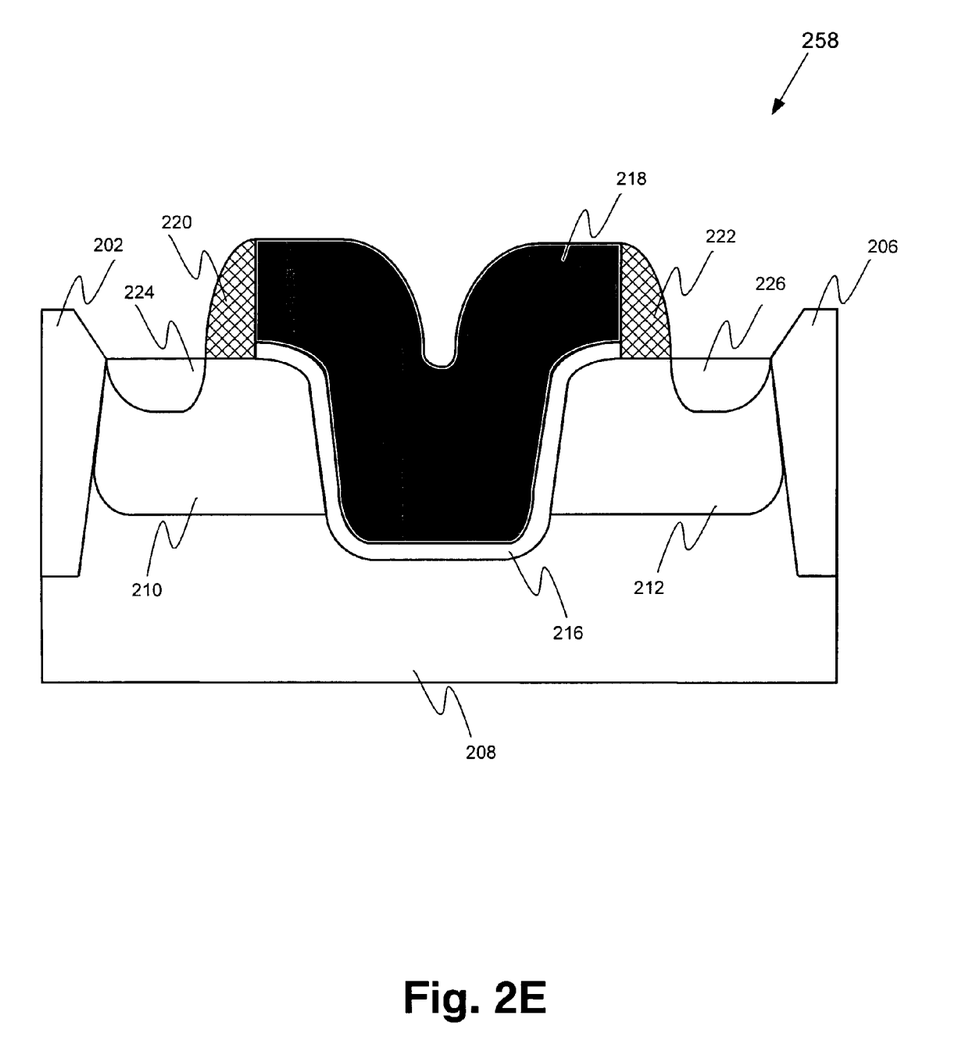
FIG. 2E illustrates a cross-sectional view, which includes portions of an exemplary structure fabricated according to an embodiment of the present invention and a corresponding process step of the flowchart of FIG. 1.

Referring to step 158 in FIG. 5 and structure 258 in FIG. 2E, at step 158 of flowchart 100, source/drain regions 224 and 226 are formed in substrate 208. In order to form source/drain regions 224 and 226, a photoresist mask (not shown) is first formed over gate 218. A self-aligned high-density n-type source/drain (NSD) implant is then performed to achieve source/drain regions 224 and 226. The photoresist mask is subsequently removed from gate 218.

Figure 2F:
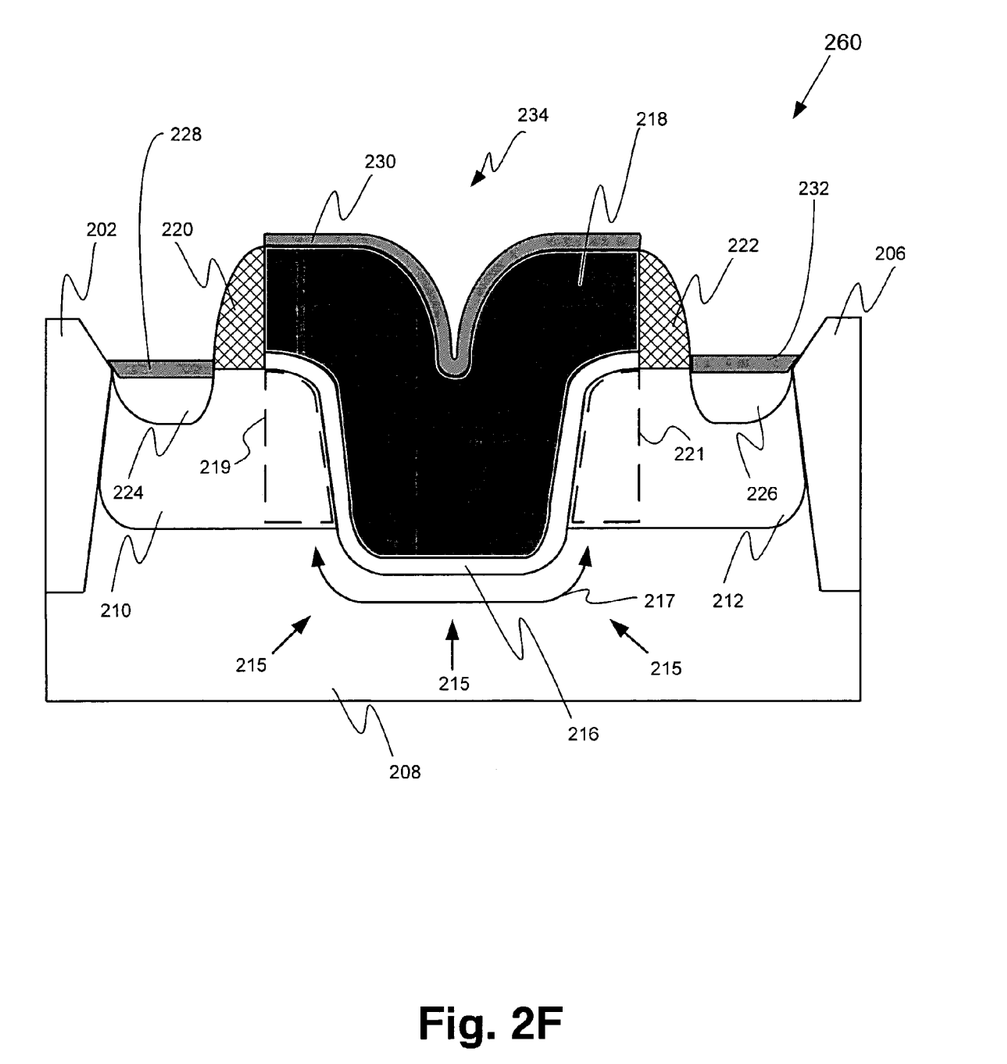
FIG. 2F illustrates a cross-sectional view, which includes portions of an exemplary structure fabricated according to an embodiment of the present invention and a corresponding process step of the flowchart of FIG. 1.

Referring to step 160 in FIG. 6 and structure 260 in FIG. 2F, at step 160 of flowchart 100, a silicide layer is formed on the gate and source/drain regions by first performing a cobalt silicide (CoSi) pre-clean. CoSi regions 228, 230, and 232 are then deposited over source/drain region 224, gate 218, and source/drain region 226, respectively. CoSi regions 228, 230, and 232 provide improved conductivity and act as electrical contacts. It is noted that other types of silicide can be used in place of CoSi.

Advantageously, gate 218 of transistor 234 has been formed with a substantially U-shape at channel region 215. As mentioned herein, this configuration is superior to conventional FETs, which typically have gates that are formed substantially parallel to the substrates on which they reside. LDD regions of conventional FETs overlap the gates in planes horizontal to the surfaces of the substrates. Due to this overlap, the BVdss of a conventional FET as measured between an LDD region and the substrate is undesirably low.

Prior attempts at compensating for the low values of BVdss exhibited by conventional FETs include increasing the length of the spacers so that the overlap between the LDD regions and the gate is minimized. However, this technique disadvantageously increases the size of the transistor.

The technique of fabricating transistor 234 additionally makes it easier to control the dopant profiles of overlap regions 219 and 221 when implanting due to the substantially or nearly y-axis direction (orthogonal to the plane of the surface of the substrate). In other words, embodiments according to the present invention advantageously make it easier to increase the value of BVdss. Embodiments according to the present invention also simplify manufacturing and improve density. High values (e.g. more than 20 volts) for BVdss can be achieved, in addition to a relatively high punch-through voltage and a decrease in transistor size.

Furthermore, embodiments according to the present invention advantageously allow for channel length 217 to be maintained while decreasing the size of the device. This is accomplished by the bowing in the U-shaped gate 218. As mentioned herein, maintaining channel length 217 is important for preventing punch-through degradation problems. Conventional approaches, in contrast, increase the size of the transistor in order to maintain a desired channel length due to the overlap of the NDD regions and the gate in the x-axis direction.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a high-voltage transistor having a U-shaped gate has been described.

The invention claimed is:

1. A transistor comprising:
   a substrate;
   first and second shallow trench isolation regions in said substrate;
   a substantially U-shaped trench situated in said substrate between said first and second shallow trench isolation regions;
   a substantially U-shaped gate situated in said substantially U-shaped trench;
   first and second lightly doped drain (LDD) implant regions situated on opposite sides of said gate;
   a channel situated below said gate, said channel having a channel length extending substantially from a first diffusion edge of said first LDD implant region to a second diffusion edge of said second LDD implant region;
   first and second spacers situated on opposite sides of said gate and situated over said substrate;
   first and second source/drain regions situated in said substrate;
   a first silicide layer situated on said first source/drain region and situated in alignment with said first spacer and a second silicide layer situated on said second source/drain region and situated in alignment with said second spacer.

2. The transistor of claim 1 wherein said substantially U-shaped gate is adjacent to an overlap region in a substantially y-axis direction.

3. The transistor of claim 1, wherein said transistor exhibits an increased value of BVdss.

4. The transistor of claim 1 wherein said transistor exhibits an increased punch-through voltage.

5. The transistor of claim 1 further comprising a silicide layer on said gate.

6. The transistor of claim 1 wherein said gate has a decreased size for a given channel length.

* * * * *